(12) United States Patent
Jang et al.

(10) Patent No.: US 9,915,681 B2
(45) Date of Patent: Mar. 13, 2018

(54) SEMICONDUCTOR TEST APPARATUS HAVING POGO PINS COATED WITH CONDUCTION FILMS

(71) Applicant: Samsung Electronics Co., Ltd., Suwon-si (KR)

(72) Inventors: Sunghoon Jang, Seoul (KR); Minsuk Choi, Seoul (KR); Byungho Choi, Hwaseong-si (KR); Taehwan Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 216 days.

(21) Appl. No.: 14/955,545

(22) Filed: Dec. 1, 2015

(65) Prior Publication Data

US 2016/0187381 A1 Jun. 30, 2016

(30) Foreign Application Priority Data

Dec. 24, 2014 (KR) .......................... 10-2014-0188634

(51) Int. Cl.
*G01R 1/067* (2006.01)
(52) U.S. Cl.
CPC ............................... *G01R 1/06722* (2013.01)
(58) Field of Classification Search
CPC ............. H01L 2924/00; G06F 12/1466; G01R 1/06744
See application file for complete search history.

(56) References Cited

U.S. PATENT DOCUMENTS

| | | | | |
|---|---|---|---|---|
| 6,034,532 | A | * 3/2000 | Tarzwell | G01R 1/06722 324/755.05 |
| 8,637,983 | B2 | 1/2014 | Martinez et al. | |
| 2006/0286715 | A1* | 12/2006 | Hasebe | G01R 1/07378 438/107 |
| 2008/0061809 | A1* | 3/2008 | Lee | G01R 1/06722 324/755.05 |
| 2010/0155938 | A1 | 6/2010 | Martinez et al. | |
| 2011/0117796 | A1* | 5/2011 | Oishi | H01R 13/2421 439/841 |
| 2012/0025861 | A1 | 2/2012 | Park et al. | |
| 2014/0061900 | A1 | 3/2014 | Park et al. | |
| 2014/0361801 | A1 | 12/2014 | Pak | |

FOREIGN PATENT DOCUMENTS

| | | |
|---|---|---|
| JP | 2000133395 | 5/2000 |
| JP | 2002040096 | 2/2002 |
| JP | 2002280428 | 9/2002 |
| JP | 2006038459 | 2/2006 |
| JP | 4382718 | 12/2009 |
| JP | 2011021939 | 2/2011 |
| JP | 2012163515 | 8/2012 |

(Continued)

*Primary Examiner* — Jermele M Hollington
*Assistant Examiner* — Alvaro Fortich
(74) *Attorney, Agent, or Firm* — Onello & Mello, LLP

(57) ABSTRACT

A semiconductor test apparatus includes a pogo pin that is provided on a board and is in contact with an inspected object. The pogo pin includes a barrel fixedly disposed on the board, a plunger movably coupled to the barrel, and a conduction film covering the pogo pin. The conduction film contacts a portion of the plunger to be electrically connected to the plunger while being electrically insulated from the barrel.

20 Claims, 8 Drawing Sheets

(56) References Cited

FOREIGN PATENT DOCUMENTS

| KR | 20110098837 | 9/2011 |
|----|-------------|--------|
| KR | 20120012512 | 2/2012 |
| KR | 101230978   | 2/2013 |
| KR | 101306469   | 9/2013 |
| KR | 101307422   | 9/2013 |
| KR | 101330999   | 11/2013 |
| KR | 20140029872 | 3/2014 |

* cited by examiner

SEMICONDUCTOR TEST APPARATUS HAVING POGO PINS COATED WITH CONDUCTION FILMS

CROSS-REFERENCE TO RELATED APPLICATIONS

This U.S. non-provisional patent application claims priority under 35 U.S.C. § 119 of Korean Patent Application 10-2014-0188634 filed on Dec. 24, 2014, the entire contents of which are hereby incorporated by reference.

FIELD OF INVENTION

The present inventive concept relates generally to a semiconductor test apparatus and, more particularly, to a semiconductor test apparatus having pogo pins coated with conduction film.

BACKGROUND

Pogo pins are generally used to electrically test semiconductor devices. An electrical test on a semiconductor device is performed by contacting the pogo pins to external terminals of semiconductor device, and then forcing voltage to and sensing voltage from the semiconductor device. Accurate electrical tests rely on correct sensing of these voltages.

SUMMARY

In accordance with aspects of the inventive concept a semiconductor test apparatus having pogo pins for facilitating accurate tests on a semiconductor device is provided.

In accordance with aspects of the inventive concept a semiconductor test apparatus having pogo pins configured to eliminate or reduce parasitic resistances is provided.

In accordance with aspects of the inventive concept a semiconductor test apparatus having pogo pins with sensors is provided.

According to aspects of the inventive concept, there is provided a semiconductor test apparatus including a pogo pin provided on a board, and configured to be in contact with an inspected object. The pogo pin includes a barrel fixedly disposed on the board, a plunger movably connected to the barrel and a conduction film wrapping the pogo pin. The conduction film contacts a portion of the plunger to be electrically connected to the plunger while being electrically insulated from the barrel.

In various embodiments, the plunger includes a tip which is configured to be in contact with the inspected object and the conduction film contacts the tip.

In various embodiments, the conduction film includes a first conduction film wrapping the plunger and contacting the tip and a second conduction film wrapping the barrel. The first conduction film can be slidably contacted to the second conduction film.

In various embodiments, the pogo pin further includes an insulation film wrapping the pogo pin, the insulation film including a first insulation film wrapping the plunger and exposing the tip and a second insulation film wrapping the barrel. The first conduction film wraps the first insulation film and contacts the exposed tip, and the second conduction film wraps the second insulation film.

In various embodiments, the pogo pin further includes a protection film including a first protection film wrapping the first conduction film and exposing a portion of the first conduction film and a second protection film wrapping the second conduction film. The exposed portion of the first conduction film can be slidably contacted to the second conduction film.

In various embodiments, the barrel includes a bottom surface adjacent to the board, the bottom surface of the barrel including a central surface connected to the board and a circumferential surface surrounding the central surface. The circumferential surface is spaced apart from the board.

In various embodiments, the second insulation film extends onto the bottom surface of the barrel to cover the circumferential surface of the barrel and the second conduction film extends onto the bottom surface of the barrel to cover the second insulation film on the circumferential surface of the barrel.

In various embodiments, the board includes a contact pad aligned with the circumferential surface of the barrel and the second conduction film is electrically connected to the contact pad.

In various embodiments, the barrel includes a top portion at an end thereof and the second insulation film wraps interior and exterior surfaces of the top portion of the barrel.

In various embodiments, the second conduction film wraps the first insulation film on the top portion of the barrel.

According to an aspect of the inventive concept, there is provided a semiconductor test apparatus including a pogo pin supported by a housing and configured to come in contact with an external terminal of a semiconductor device and a board on which the pogo pin vertically stands. The pogo pin includes a barrel having a spring disposed therein, a plunger coupled to the spring to be movably coupled to the barrel, the plunger having a tip for contacting an external terminal of the semiconductor device and a sensor electrically connected to the plunger and electrically insulated from the barrel. The board includes a contact pad that extends around an outer circumference of the barrel and is electrically connected to the sensor.

In various embodiments, the barrel includes a bottom surface adjacent to the board, the bottom surface of the barrel including a central surface coupled to the board and a circumferential surface surrounding the central surface, the circumferential surface being not in contact with the board. The sensor extends onto the bottom surface of the barrel to be electrically connected to the contact pad.

In various embodiments, the sensor includes a first conduction film covering at least a portion of the plunger and contacting the tip and a second conduction film covering at least a portion of the barrel and extending onto the circumferential surface of the barrel. The first conduction film is in slidable contact with the second conduction film, and the second conduction film is provided on the circumferential surface of the barrel to be connected to the contact pad.

In various embodiments, the barrel includes a top portion extending inwardly toward the plunger, and the second conduction film is folded into a "U" shape to cover interior and exterior surfaces of the top portion of the barrel.

In various embodiments, the pogo pin further includes a first insulation film covering at least a portion of the plunger and exposing the tip and a second insulation film covering at least a portion of the barrel and extending onto the bottom surface of the barrel to cover the circumferential surface of the barrel. The second insulation film electrically insulates the second conduction film from the barrel.

In various embodiments, the pogo pin further includes a first protection film covering at least a portion of the first conduction film, the first protection film exposing a portion of the first conduction film and a second protection film covering at least a portion of the second conduction film without extending onto the bottom surface of the barrel. The exposed portion of the first conduction film is in slidable contact with the second conduction film.

In various embodiments, the barrel is configured to move within the barrel and the first conduction film has an exposed portion whose length is substantially identical to or greater than a retraction length of the plunger.

According to an aspect of the inventive concept, there is provided a semiconductor test apparatus including a board including a contact pad thereon and a pogo pin disposed on the board in contact with the contact pad. The pogo pin includes a barrel fixedly disposed on the board, the barrel having a spring embedded therein, a plunger coupled to the spring to be movably coupled to the barrel, the plunger having a tip for contacting an external terminal of a semiconductor device and a multiple-layer film coating the pogo pin, at least a portion of the multiple-layer film contacting the tip to be electrically connected to the plunger and electrically insulated from the barrel.

In various embodiments, the multiple-layer film includes an inner insulation film covering a portion of the pogo pin and exposing the tip, a conduction film provided on the inner insulation film and in contact with the tip and an outer insulation film partially covering the conduction film. The conduction film electrically connects the contact pad to the tip.

In various embodiments, the barrel includes a non-planar bottom surface adjacent to the board, the non-planar bottom surface of the barrel including a circumferential surface aligned with the contact pad and spaced apart from the board and a central surface surrounded by the circumferential surface, the central surface protruding toward the board to be in contact with the board. The inner insulation film extends over the bottom surface of the barrel to cover the circumferential surface of the barrel and the conduction film extends over the bottom surface of the barrel to contact the contact pad.

In various embodiments, the conduction film includes a first conduction film covering at least a portion of the plunger and contacting the tip and a second conduction film covering at least a portion of the barrel and extending over the circumferential surface of the barrel. The plunger is configured to move within the barrel in response to expansion and contraction of the spring such that the first conduction film is in slidable contact with the second conduction film.

In various embodiments, the inner insulation film includes a first insulation film between the plunger and the first conduction film, the first insulation film not covering the tip and a second insulation film between the barrel and the second conduction film, the second insulation film electrically insulating the second conduction film from the barrel.

In various embodiments, the outer insulation film includes a first protection film covering the first conduction film while exposing a portion of the first conduction film, the portion of the first conduction film contacting the second conduction film and a second protection film covering a portion of the second conduction film without extending onto the bottom surface of the barrel.

According to an aspect of the inventive concept, there is provided a semiconductor test apparatus including at least one pogo pin provided on a board, each of the at least one pogo pin being configured to be in contact with an inspected object and including a barrel disposed on the board, a plunger partially housed within the barrel, the plunger including a tip which is configured to be in contact with the inspected object, a first conduction film covering at least a portion of the plunger and a second conduction film covering at least a portion of the barrel. The first conduction film contacts the tip to be electrically connected to the plunger and the first conduction film is in slidable contact with the second conduction film, thereby forming an electrical connection between the tip and a contact pad disposed on the board.

In various embodiments, the pogo pin further includes a first insulation film covering a portion of the plunger, not including the tip and a second insulation film covering at least a portion of the barrel. The first conduction film covers at least a portion of the first insulation film and contacts the tip, and the second conduction film covers at least a portion of the second insulation film.

In various embodiments, the pogo pin further includes a protection film, the protection film including a first protection film covering a portion of the first conduction film while a portion of the first conduction film remains exposed and a second protection film covering at least a portion of the second conduction film. The exposed portion of the first conduction film is in slidable contact with the second conduction film.

In various embodiments, the barrel includes a bottom surface adjacent to the board, the bottom surface of the barrel including a central surface in contact with the board and a peripheral surface surrounding the central surface, the peripheral surface not in contact with board.

In various embodiments, the second insulation film extends over the bottom surface of the barrel to cover the peripheral surface of the barrel and the second conduction film extends over the bottom surface of the barrel to cover the second insulation film on the peripheral surface of the barrel.

In various embodiments, the board includes a contact pad aligned with the peripheral surface of the barrel and the second conduction film is electrically connected to the contact pad.

In various embodiments, the barrel includes a top portion at an end thereof and the second insulation film covers interior and exterior surfaces of the top portion of the barrel.

In various embodiments, the second conduction film covers the first insulation film on the top portion of the barrel.

In various embodiments, a spring is housed within the barrel between a bottom surface of the barrel and an end portion of the plunger, the spring providing a biasing force between the barrel and the plunger

BRIEF DESCRIPTION OF THE DRAWINGS

Exemplary embodiments of one or more new and useful process, machine, manufacture, and/or improvement thereof, in accordance with the inventive concept, are provided in the following detailed description taken in conjunction with the accompanying drawings, in which.

DETAILED DESCRIPTION OF EXEMPLARY EMBODIMENTS

Figure 1:
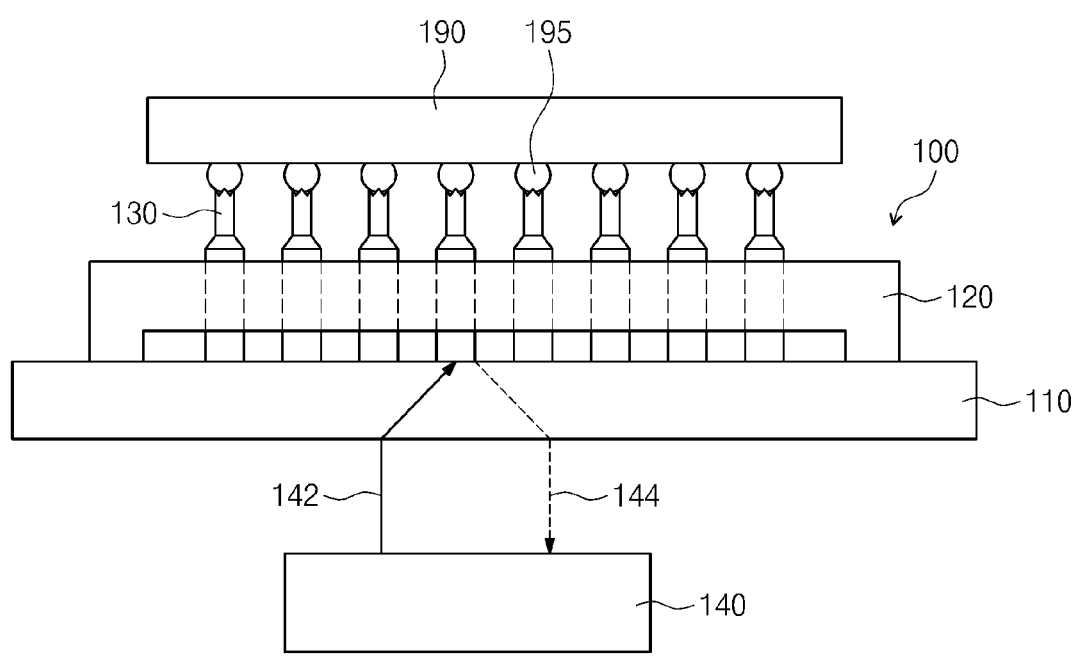
FIG. 1 is a schematic diagram illustrating a semiconductor test apparatus according to aspects of the present inventive concept.

Aspects of the inventive concept will now be described more fully with reference to the accompanying drawings, in which exemplary embodiments are shown. The inventive concept may, however, be embodied in many different forms and should not be construed as limited to the exemplary embodiments set forth herein. Reference numerals are denoted in detail in the exemplary embodiments of the inventive concept and their examples are indicated in the accompanying drawings. The same reference numerals are used in the description and drawings in order to refer to the same or similar parts wherever possible.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

To the extent that functional features, operations, and/or steps are described herein, or otherwise understood to be included within various embodiments of the inventive concept, such functional features, operations, and/or steps can be embodied in functional blocks, units, modules, operations and/or methods. And to the extent that such functional blocks, units, modules, operations and/or methods include computer program code, such computer program code can be stored in a computer readable medium, e.g., such as non-transitory memory and media, that is executable by at least one computer processor.

FIG. 1 is a schematic diagram illustrating an embodiment of a semiconductor test apparatus according to aspects of the present inventive concept.

Referring to FIG. 1, a semiconductor test apparatus 100 includes a socket 120 provided on a board 110, such as a printed circuit board, at least one pogo pin 130 positioned on the board 110 while supported by the socket 120, and a power supply 140 electrically connected to the board 110. A semiconductor device 190 may be a wafer-level or chip-level semiconductor die or package including at least one external terminal 195, such as a solder ball. The board 110 includes electrical contact pad 112 (FIG. 2) electrically connecting the power supply to the pogo pins 130.

An electrical test is performed by forcing a voltage to the semiconductor device 190 via the one or more pogo pins 130 and sensing voltage from the semiconductor device 190 via the one or more pogo pins 130. For example, when a pogo pin 130 is brought into contact with the external terminal 195 of semiconductor 190, the power supply 140 may provide voltage (e.g., a supply voltage) into the pogo pin 130. The voltage provided into the pogo pin 130 is transmitted into the external terminal 195 and the voltage transmitted into the semiconductor device 190 is sensed. The pogo pin 130 and the external terminal 195 may be electrically connected to each other in any connection manner known in the art, such as a Kelvin Contact.

Figure 2A:
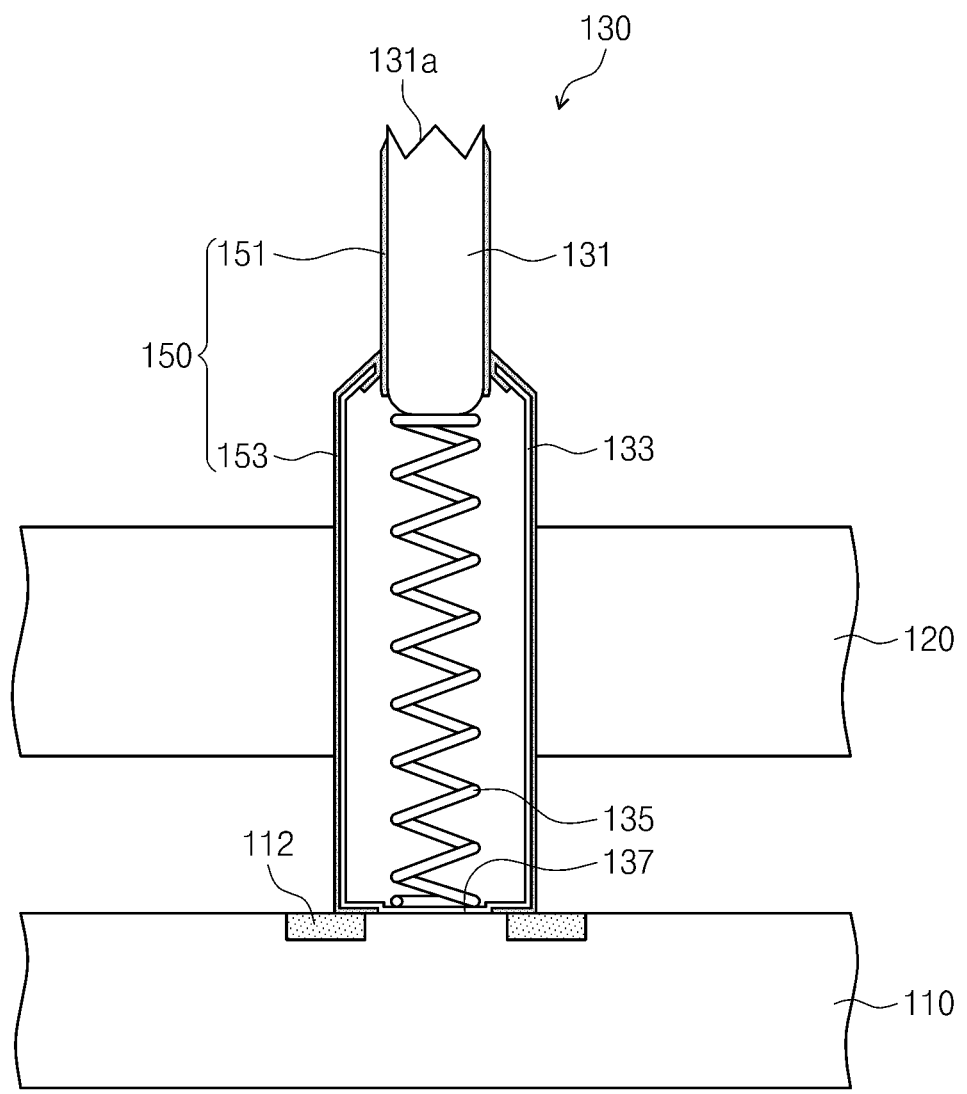
FIGS. 2A and 2B are cross-sectional view diagrams illustrating a pogo pin of the semiconductor test apparatus according to aspects of the present inventive concept.
Figure 2B:
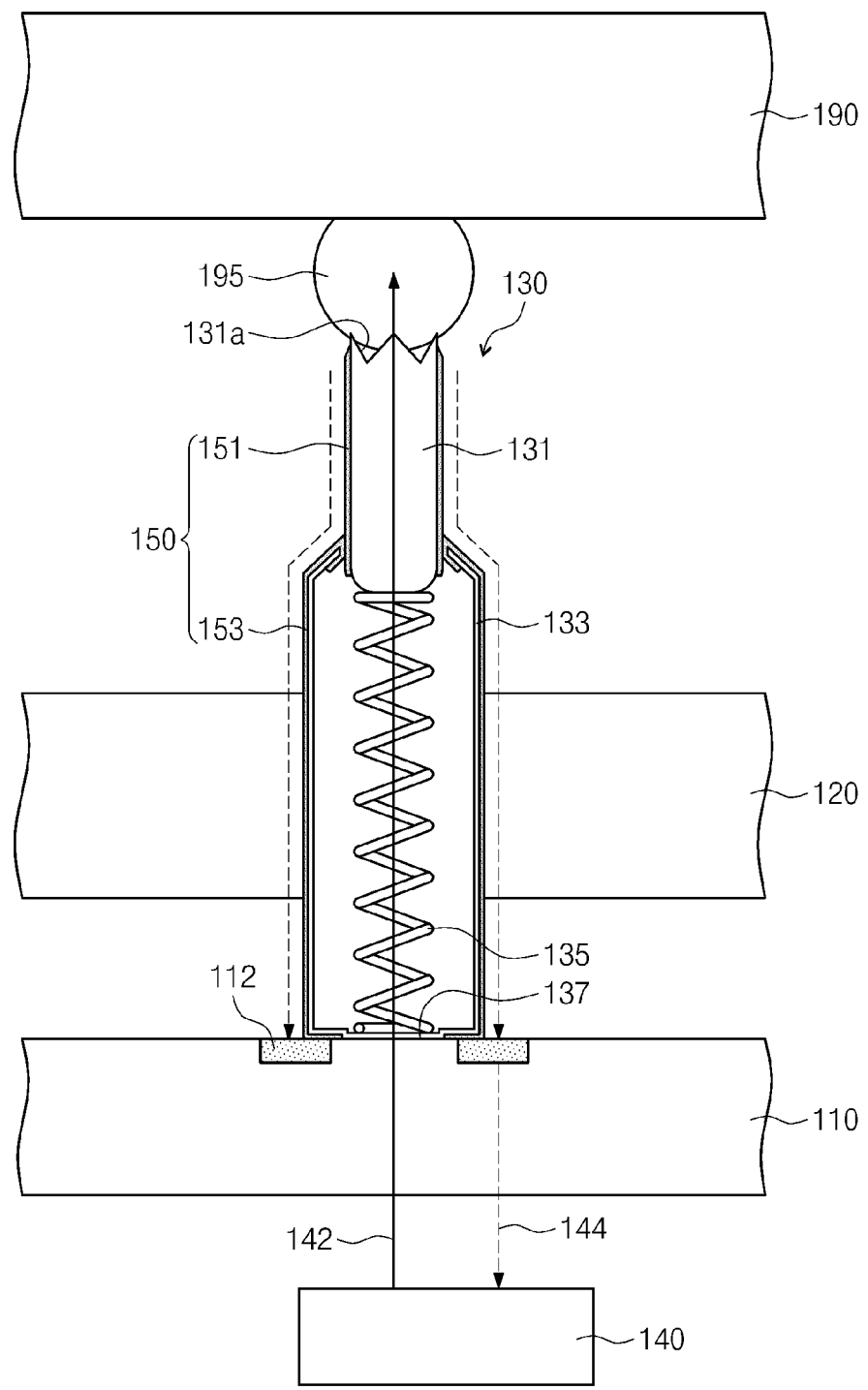
Figure 2C:
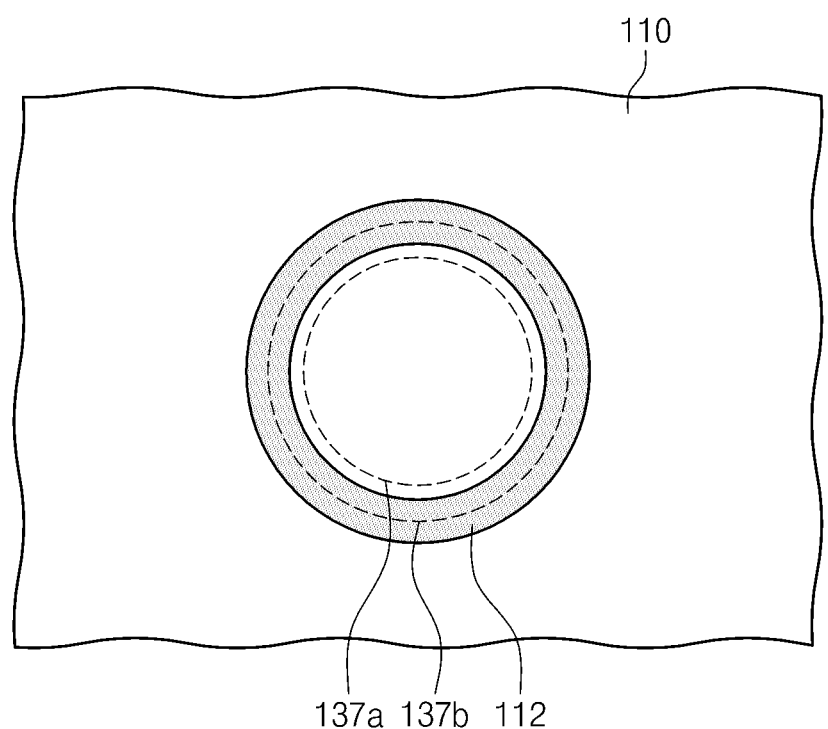
FIG. 2C is a plan view diagram illustrating a board of the semiconductor test apparatus according to aspects of the present inventive concept.
Figure 3A:
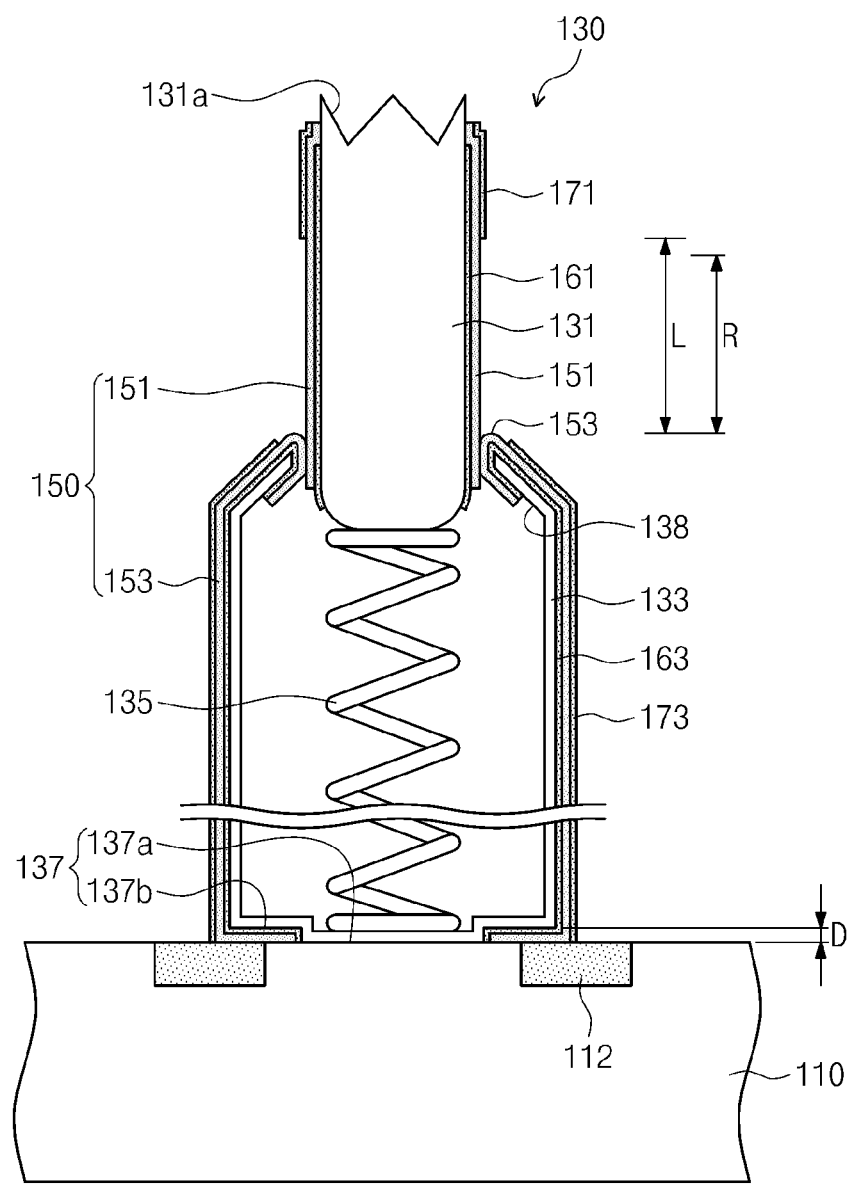
FIGS. 3A and 3B are enlarged cross-sectional diagrams of portions of FIG. 2A and 2B, respectively, according to aspects of the present inventive concept.
Figure 3B:
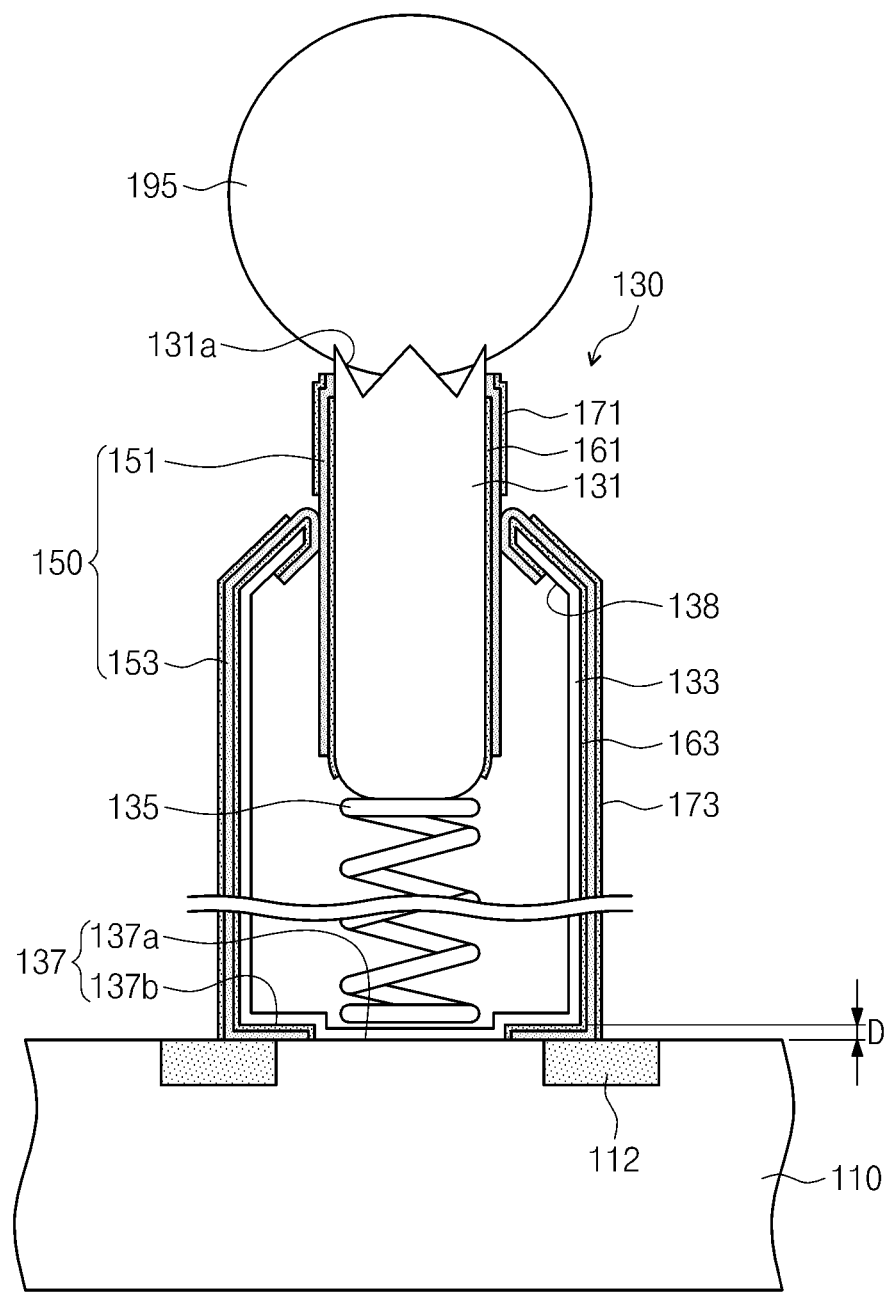

FIGS. 2A and 2B are cross-sectional view diagrams illustrating an embodiment of a pogo pin 130 of the semiconductor test apparatus 100 according to aspects of the present inventive concept. FIG. 2C is a plan view illustrating a portion of board 110 of the semiconductor test apparatus 100 according to aspects of the present inventive concept. FIGS. 3A and 3B are enlarged cross-sectional view diagrams of portions of FIG. 2A and 2B, respectively.

Referring to FIG. 2A, the pogo pin 130 includes a barrel 133 provided on the board 110 and a plunger 131 received in the barrel 133. According to an aspect of the inventive concept, the barrel 133 has a hollow cylindrical shape and is fixedly disposed on the board 110. A spring 135 is embedded in the barrel 133 and coupled to the plunger 131, which may be solid or hollow cylindrical, and includes a crown-shaped contact tip 131 a at one end thereof.

The socket 120 serves as a case or housing for supporting the pogo pin 130, which is held in place on the board in the socket 120. The board 110 includes an annular electrical contact pad 112, on which the barrel 133 is positioned.

According to aspects of the inventive concept, the pogo pin 130 is formed of conductive material and the socket 120 is formed of insulating material. For example, at least one of the plunger 131 and the barrel 133 may be formed of a conductive material such as brass, beryllium copper, bronze, phosphor bronze, nickel silver, and so forth. Further, spring 135 may be formed of a conductive material such as steel, stainless steel, beryllium copper, and so forth. Socket 120 may be formed of an insulating material such as plastic, rubber, and so forth.

According to aspects of the inventive concept, an outer surface of the pogo pin 130 is covered with a conduction film 150. For example, the conduction film 150 may include a first conduction film 151 covering the outer surface of the plunger 131 and a second conduction film 153 covering the outer surface of the barrel 133. The first conduction film 151 is in contact with the second conduction film 153, and the second conduction film 153 is in contact with the contact pad 112. At least one of the first and second films 151 and 153 includes a material substantially identical or similar to the material of the plunger 131 and/or the barrel 133.

Referring to FIG. 2B, when the pogo pin 130 is brought into contact with the external terminal 195, the contact tip 131a directly contacts the external terminal 195, and the spring 135 contacts and the plunger 131, which slides into an interior of the barrel 133. As the plunger 131 slides into the interior of the barrel 134, the second conduction film 153 remains in contact with the first conduction film 151.

Referring to FIG. 3A, according to an aspect of the inventive concept, the conduction film 150 contacts only a portion of the pogo pin 130. For example, a first insulation film 161 is interposed between the plunger 131 and the first conduction film 151, and a second insulation film 163 is interposed between the barrel 133 and the second conduction film 153. A top portion of the first conduction film 151 is in contact with the contact tip 131a of the plunger 131, and a bottom portion of the second conduction film 153 extends onto a bottom surface 137 of the barrel 133 to be coupled to the contact pad 112 on the board 110. In other words, the top portion of the first conduction film 151 contacts the contact tip 131a while a remainder of the first conduction film 151 does not contact the plunger 131, as the first insulation film 161 is disposed between the plunger 131 and the first conduction film 151. The second conduction film 153 is coupled to the contact pad 112 without contacting the barrel 133, since the second insulation film 163 is disposed between the barrel 133 and the second conduction film 153.

According to an aspect of the inventive concept, the bottom surface 137 of the barrel 133 is non-planar. For example, as shown in FIGS. 2C and 3A, the bottom surface 137 of the barrel 133 includes a central surface 137a fixedly connected to the board 110 and a circumferential surface 137b surrounding the central surface 137a. The circumferential surface 137b is situated in a plane different from that of the central surface 137a. As shown in FIG. 2C, the central surface 137a has a circular shape and the circumferential surface 137b has a loop shape in plan view. The central surface 137a projects toward the board 110 compared with the circumferential surface 137b, As a result, a height difference D is present between the bottom of central surface 137a and the bottom of circumferential surface 137b, such that the circumferential surface 137b is not in direct contact with the board 110.

The barrel 133 includes a top portion 138 extending inwardly toward the plunger 131 and the second conduction film 153 and second insulation film 163 cover the top portion 138 of the barrel 133. For example, a top portion of the second insulation film 163 is folded into a "U" shape to cover exterior and interior sections of the top portion 138 of the barrel 133. Similarly, a top portion of the second conduction film 153 is folded into a "U" shape to overwrap exterior and interior sections of the top portion 138 of the barrel 133, over the second insulation layer 163. As shown in FIG. 3A, second insulation film 163 remains between second conduction layer 153 and barrel 133, including top portion 138.

According to aspects of the inventive concept, a first protection film 171 covers at least a portion of the first conduction film 151, and a second protection film 173 covers at least a portion of the second conduction film 153. The first and second protection films 171 and 173 may include an insulating material.

Second protection film 173 is provided on an outer surface of the top portion 138 of the barrel 133, but does not extend onto an inner surface of the top portion 138 of the barrel 133. Consequently, the first conduction film 151 directly contacts the second conduction film 153. The second protection film 173 also does not extend onto the bottom surface 137 of the barrel 133, which enables the second conduction film 153 to directly contact the contact pad 112.

First protection film 171 partially covers the first conduction film 151 such that a portion of the first conduction film 151 is exposed. For example, the first conduction film 151 may have an exposed length L greater than or identical to a retraction distance R of the plunger 131 that the plunger 131 is able to slide into the barrel 133. As shown in FIG. 3B, which shows plunger 131 retracted into barrel 133, because the first conduction film 151 has the exposed portion not covered by first protection film 171, it is able to maintain a direct contact between the first conduction film 151 and the second conduction film 153 even as the plunger 131 slides into the barrel 133.

Figure 4:
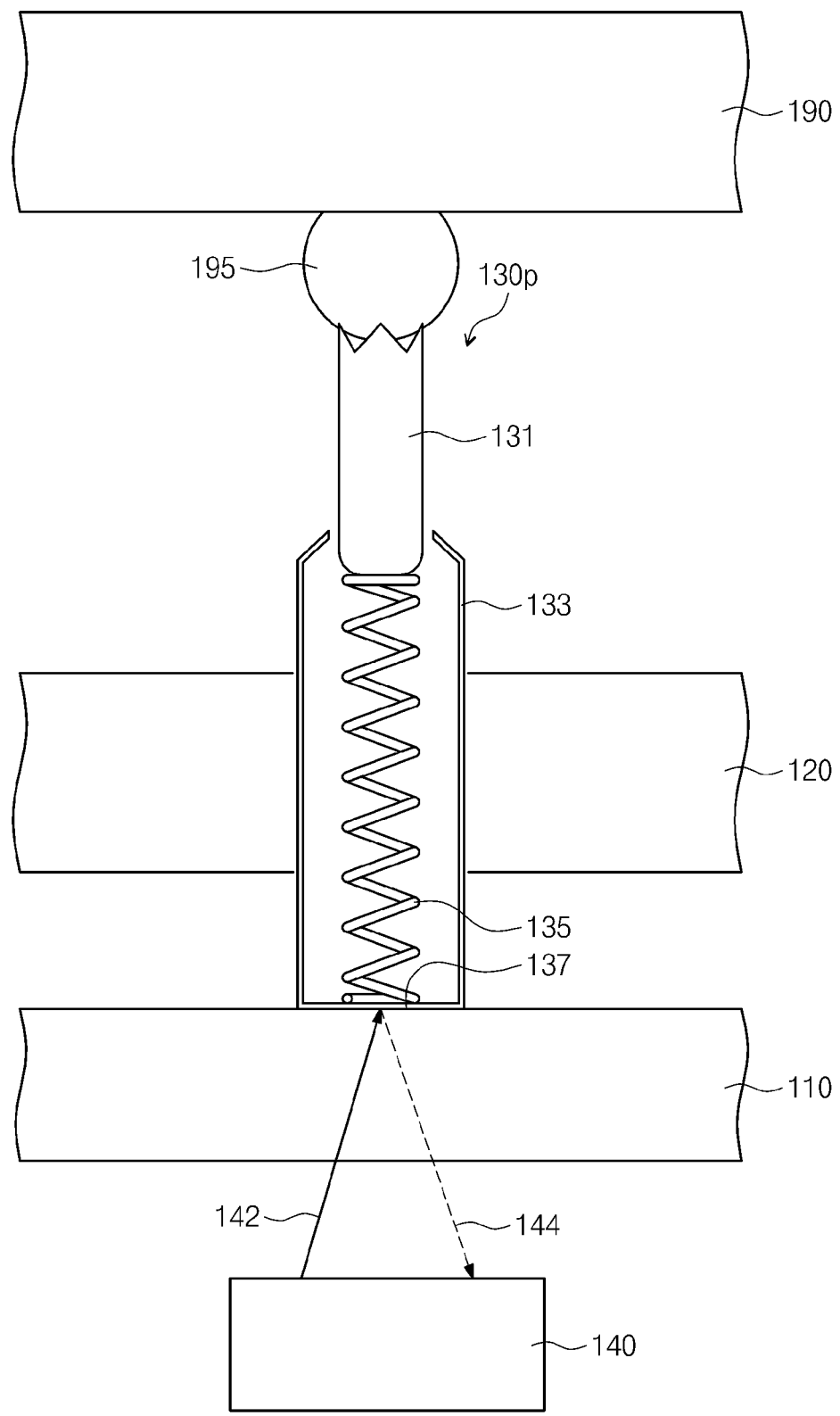
FIG. 4 is a cross-sectional view diagram illustrating a pogo pin according to aspects of the present inventive concept.

FIG. 4 is a cross-sectional view diagram illustrating an embodiment of a pogo pin according to an aspect of the inventive concept.

Referring back to FIG. 2B, when the pogo pin 130 is brought into contact with the external terminal 195, the contact tip 131 *a* contacts the external terminal 195 to facilitate the electrical testing of the semiconductor device 190. In the electrical test, a forcing function 142 (shown by a solid line) is conducted by inputting a test voltage to the terminal 195 over path 142, which includes central surface 137a of barrel 133, spring 135 and plunger 131 of pogo pin 130. A sensing function 144 (shown by dashed lines) is then conducted through the conduction film 150 and contact pad 112.

In an aspect of the inventive concept, the conduction film 150 is used as a sensor. As shown in FIG. 3B, first conduction film 151 of conduction film 150 contacts the contact tip 131 *a*, to facilitate the sensing function 144 under the condition of reduced or eliminated voltage drop caused by a parasitic resistance, for example, a contact resistance between the pogo pin 130 and the external terminal 195 or resistance of the pogo pin 130 itself.

Differently, when the semiconductor device 190 is electrically tested using the pogo pin 130p without the conduction film shown in FIG. 4, both the forcing function 142 and the sensing function 144 may conduct at the same point, for example, bottom surface 137 of the pogo pin 130p. In this case, the sensing function 144 may be inaccurate due to voltage drop generating from a parasitic resistance such as a contact resistance between the pogo pin 130p and the external terminal 195 or resistance of the pogo pin 130p itself.

According to an aspect of the inventive concept, the conduction film 150 serves as a sensor to conduct the sensing function 144 under the condition of reduced or eliminated parasitic resistance. The pogo pin 130 provides, through forcing function 142, the external terminal 195 with a voltage having a value that is the same as the sensed voltage, which improves accuracy of the electrical test on the semiconductor device 190.

Figure 5A:
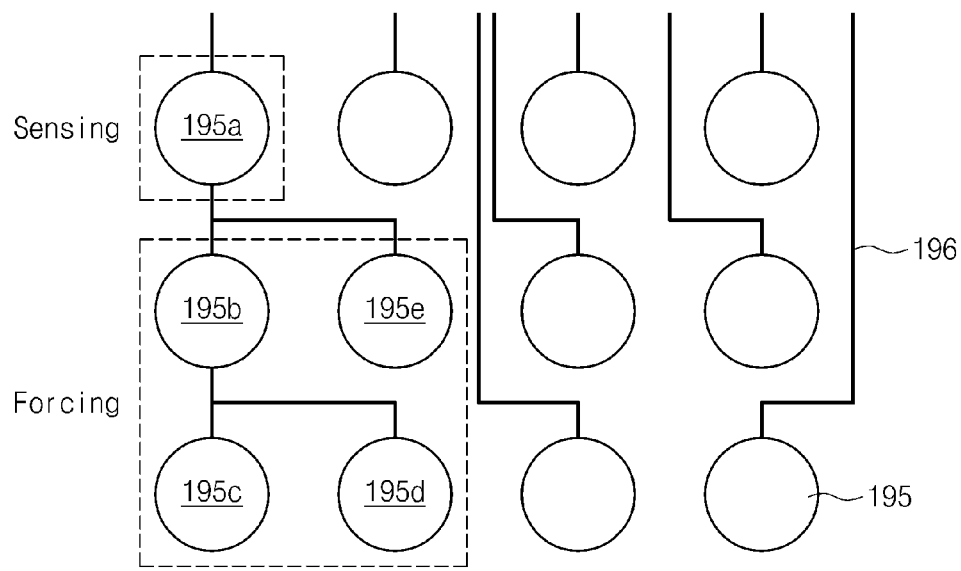
FIGS. 5A and 5B are plan view diagrams illustrating arrangements of external terminals in the semiconductor device of FIG. 1, according to aspects of the present inventive concept.
Figure 5B:
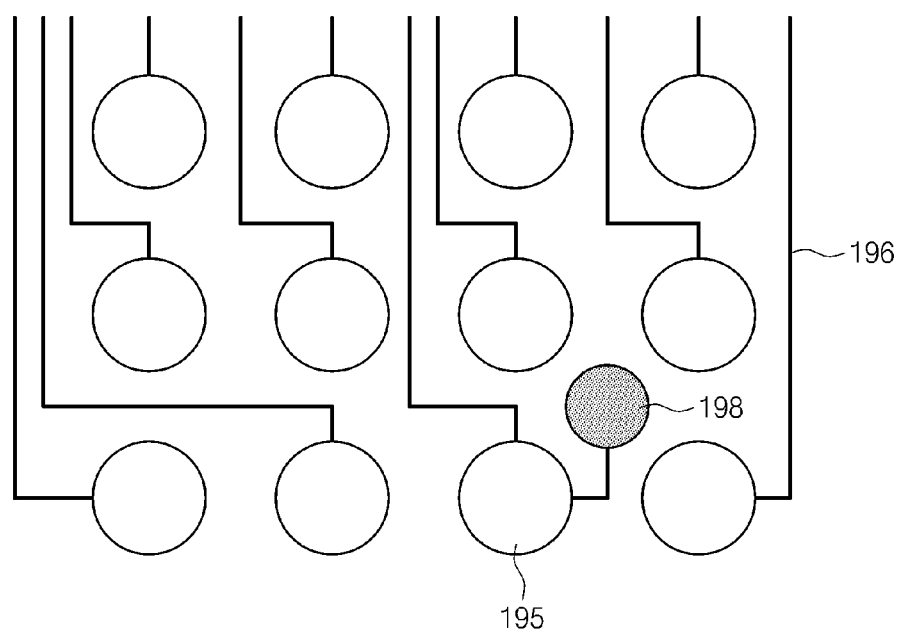

FIGS. 5A and 5B are plan views illustrating arrangement of embodiments of external terminals in the semiconductor device of FIG. 1, according to aspects of the inventive concept.

Referring to FIG. 5A, the electrical test is performed by connecting the pogo pins 130 to external terminals 195*a* to 195*e*, which are electrically connected to each other through lines 196. For example, of the external terminals 195*a* to 195*e*, one external terminal 195*a* may be used for the sensing function and the rest external terminals 195*b* to 195*e* may be used for the forcing function.

The pogo pin 130 coated with the conduction film 150 of FIG. 3A contacts the external terminal 195*a* to sense voltage under the condition of reduced or eliminated parasitic resistance. The pogo pins 130 respectively provide the external terminals 195*b* to 195*e* with voltage substantially the same as sensed voltage.

Referring to FIG. 5B, the electrical test is performed by connecting at least one of the external terminals 195 to an additional terminal 198 such as a redistribution pad or solder ball. For example, the pogo pin 130 of FIG. 3A may contact the additional terminal 198. In an exemplary embodiment, it may be possible to sense voltage under the condition of reduced or eliminated parasitic resistance and further prevent damage to the external terminal 195 caused by the direct contact of the pogo pin 130.

According to aspects of the inventive concept, the conduction film covering the pogo pin is used as a sensor to reduce or eliminate a parasitic resistance, thereby improving accuracy of an electrical test on the semiconductor device.

While embodiments in accordance with the inventive concept have been particularly shown and described with reference to exemplary drawings thereof, it will be understood that various changes in form and details may be made therein without departing from the spirit and scope of the following claims, which cover that shown and described with respect to the figures, as well as physical and/or functional equivalents thereof.

What is claimed is:

1. A semiconductor test apparatus comprising:
a pogo pin provided on a board, and configured to be in contact with an inspected object, the pogo pin including:
a barrel fixedly disposed on the board;
a plunger movably connected to the barrel; and
a conduction film wrapping the pogo pin,
wherein the conduction film contacts a portion of the plunger to be electrically connected to the plunger while being electrically insulated from the barrel.

2. The semiconductor test apparatus of claim 1, wherein:
the plunger includes a tip which is configured to be in contact with the inspected object, and
the conduction film contacts the plunger tip.

3. The semiconductor test apparatus of claim 2, wherein the conduction film comprises:
a first conduction film wrapping the plunger and contacting the plunger tip; and
a second conduction film wrapping the barrel,
wherein the first conduction film is slidably contacted to the second conduction film.

4. The semiconductor test apparatus of claim 3, wherein the pogo pin further comprises an insulation film wrapping the pogo pin, the insulation film including:
a first insulation film wrapping the plunger and exposing the plunger tip; and
a second insulation film wrapping the barrel,
wherein the first conduction film wraps the first insulation film and contacts the exposed plunger tip, and the second conduction film wraps the second insulation film.

5. The semiconductor test apparatus of claim 4, wherein the pogo pin further comprises a protection film, the protection film including,
a first protection film wrapping the first conduction film and exposing a portion of the first conduction film; and
a second protection film wrapping the second conduction film,
wherein the exposed portion of the first conduction film is slidably contacted to the second conduction film.

6. The semiconductor test apparatus of claim 5, wherein the barrel comprises a bottom surface adjacent to the board, the bottom surface of the barrel including:
a central surface connected to the board; and
a circumferential surface surrounding the central surface,
wherein the circumferential surface is spaced apart from the board.

7. The semiconductor test apparatus of claim 6, wherein:
the second insulation film extends onto the bottom surface of the barrel to cover the circumferential surface of the barrel, and
the second conduction film extends onto the bottom surface of the barrel to cover the second insulation film on the circumferential surface of the barrel.

8. The semiconductor test apparatus of claim 7, wherein:
the board comprises a contact pad aligned with the circumferential surface of the barrel, and
the second conduction film is electrically connected to the contact pad.

9. The semiconductor test apparatus of claim 5, wherein:
the barrel comprises a top portion at an end thereof, and
the second insulation film wraps interior and exterior surfaces of the top portion of the barrel.

10. The semiconductor test apparatus of claim 9,
wherein the second conduction film wraps the second insulation film on the top portion of the barrel.

11. A semiconductor test apparatus comprising:
a pogo pin supported by a housing and configured to come in contact with an external terminal of a semiconductor device; and
a board on which the pogo pin vertically stands,
wherein the pogo pin includes:
a barrel including a spring disposed therein;
a plunger coupled to the spring to be movably coupled to the barrel, the plunger having a tip for contacting the external terminal of the semiconductor device; and
a sensor electrically connected to the plunger and electrically insulated from the barrel,
wherein the board includes:
a contact pad that extends around an outer circumference of the barrel and is electrically connected to the sensor.

12. A semiconductor test apparatus comprising:
at least one pogo pin provided on a board, each of the at least one pogo pin being configured to be in contact with an inspected object and including:
a barrel disposed on the board;
a plunger partially housed within the barrel, the plunger including a tip which is configured to be in contact with the inspected object;
a first conduction film covering at least a portion of the plunger; and a second conduction film covering at least a portion of the barrel;
wherein the first conduction film contacts the plunger tip to be electrically connected to the plunger; and
wherein the first conduction film is in slidable contact with the second conduction film, thereby forming an electrical connection between the plunger tip and a contact pad disposed on the board.

13. The semiconductor test apparatus of claim 12, wherein the pogo pin further comprises:
a first insulation film covering a portion of the plunger, not including the plunger tip; and
a second insulation film covering at least a portion of the barrel;
wherein the first conduction film covers at least a portion of the first insulation film and contacts the plunger tip, and the second conduction film covers at least a portion of the second insulation film.

14. The semiconductor test apparatus of claim 13, wherein the pogo pin further comprises a protection film, the protection film including:
a first protection film covering a portion of the first conduction film while a portion of the first conduction film remains exposed; and
a second protection film covering at least a portion of the second conduction film,
wherein the exposed portion of the first conduction film is in slidable contact with the second conduction film.

15. The semiconductor test apparatus of claim 13, wherein the barrel comprises a bottom surface adjacent to the board, the bottom surface of the barrel including:
a central surface in contact with the board; and
a peripheral surface surrounding the central surface, the peripheral surface not in contact with board.

16. The semiconductor test apparatus of claim 15, wherein:
the second insulation film extends over the bottom surface of the barrel to cover the peripheral surface of the barrel, and
the second conduction film extends over the bottom surface of the barrel to cover the second insulation film on the peripheral surface of the barrel.

17. The semiconductor test apparatus of claim 16, wherein:
the board includes the contact pad aligned with the peripheral surface of the barrel, and
the second conduction film is electrically connected to the contact pad disposed on the board.

18. The semiconductor test apparatus of claim 12, wherein:
the barrel comprises a top portion at an end thereof, and
the second insulation film covers interior and exterior surfaces of the top portion of the barrel.

19. The semiconductor test apparatus of claim 18, wherein the second conduction film covers the first insulation film on the top portion of the barrel.

20. The semiconductor test apparatus of claim 12, further comprising a spring housed within the barrel between a bottom surface of the barrel and an end portion of the plunger, the spring providing a biasing force between the barrel and the plunger.

* * * * *